US005886545A

United States Patent [19]

Sakuda et al.

[11] Patent Number: 5,886,545

[45] Date of Patent: Mar. 23, 1999

[54] PRIORITY SWITCHING APPARATUS OF INPUT SIGNAL

[75] Inventors: Junji Sakuda; Yoshikazu Sakai; Tadahiko Hiraka, all of Ishikawa, Japan

[73] Assignee: NANAO Corporation, Japan

[21] Appl. No.: 711,394

[22] Filed: Sep. 3, 1996

[30] Foreign Application Priority Data

Sep. 4, 1995 [JP] Japan .................................. 7-226341

[51] Int. Cl.[6] ........................ H03K 19/00; H04N 5/268

[52] U.S. Cl. ........................................ 327/99; 348/705

[58] Field of Search ............................ 327/18, 19, 20, 327/39–47, 99, 141, 142, 407, 408, 411; 348/312, 311, 705, 706

[56] References Cited

U.S. PATENT DOCUMENTS

| | | | |
|---|---|---|---|
| 4,460,918 | 7/1984 | Flasza | 358/21 |
| 4,665,438 | 5/1987 | Miron et al. | 358/183 |
| 4,682,234 | 7/1987 | Naimpally | 358/183 |
| 4,954,880 | 9/1990 | Tanimizu | 358/17 |
| 5,034,818 | 7/1991 | Baik-Hee | 358/181 |
| 5,202,765 | 4/1993 | Lineberry | 358/183 |
| 5,361,099 | 11/1994 | Kim | 348/555 |
| 5,438,375 | 8/1995 | Sasabe et al. | 348/706 |

OTHER PUBLICATIONS

*Patent Abstracts of Japan* , vol. 18, No. 284 (P–1745) May 30, 1994; JP–A–06 051730, Feb. 25, 1994.

*Patent Abstracts of Japan* , vol. 18, No. 284, (P–1745), May 30, 1994; JP–A–06 051729, Feb. 25, 1994.

*Primary Examiner*—Timothy P. Callahan

*Assistant Examiner*—My-Trang Nu Ton

*Attorney, Agent, or Firm*—Ostrolenk, Faber, Gerb, & Soffen, LLP

[57] ABSTRACT

An input signal from a Dsub connector and BNC connectors is selected by an analog switch. The frequency of horizontal and vertical synchronizing signals applied from one connector end is measured by a synchronizing frequency detection circuit. The frequencies of horizontal and vertical synchronizing signals applied from the other connector end are converted into voltage values by F/V converters. A microcomputer determines the presence of a synchronizing signal and selects an input signal from the connector end of a high priority level set in a non-volatile memory.

16 Claims, 4 Drawing Sheets

| fh(khz) | ADH(V) |
|---|---|
| 20 | 4.08 |
| 30 | 3.66 |
| 40 | 3.26 |
| 60 | 2.36 |
| 80 | 1.5 |
| 100 | 0.66 |

| fv(hz) | ADV(V) |
|---|---|
| 40 | 4.46 |
| 50 | 4.38 |
| 60 | 4.28 |
| 80 | 3.94 |
| 100 | 3.52 |
| 120 | 3.02 |
| 140 | 2.5 |
| 160 | 1.82 |

PRIORITY SWITCHING APPARATUS OF INPUT SIGNAL

BACKGROUND OF THE INVENTION

1. Field of the Invention

The present invention relates to priority switching apparatuses of an input signal. More particularly, the present invention relates to a priority switching apparatus of an input signal that can automatically switch among input signals applied to respective input terminals in a monitor display device including a plurality of input terminals.

2. Description of the Background Art

The spread of personal computers in these days is remarkable. The color display monitors connected to these personal computers are provided with various functions. One such function is an input switching function. BNC connectors and a Dsub connector are provided at the back side of the display. Input signals that are applied to these connectors can be switched by a switch that is provided at the front side of the display. A BNC connector is connected individually to a coaxial cable for each video signal of R, G, and B, and to horizontal and vertical synchronizing signals respectively. The Dsub connector includes a plurality of pins. The coaxial cable of each video signal of R, G, and B and horizontal and vertical synchronizing signals is connected to the pins of the Dsub connector. A system is proposed in Japanese Laid-Open Patent No. 6-51729 wherein an input signal path with a synchronizing signal is automatically detected and switched to even when a plurality of input terminals are connected.

A display employing such a method can be installed in dealing rooms of banks and securities companies. The display may be used as a monitor of a word processor, and switched, if necessary, to display stock information, for example. However, a limitation exists in that the switch of the display must be effected every time to confirm whether stock information is displayed or not. In other words, a change in the signal that is not displayed cannot be identified in real time. Information cannot be obtained instantaneously when used in dealing systems and the like.

In order to automatically switch the input of the display when stock information, for example, is input as input signals, the switching circuit disclosed in the aforementioned Japanese Laid-Open Patent No. 6-51729 detects the frequency of a synchronizing signal of an input signal of another terminal when the currently selected input terminal does not have a synchronizing signal, and the input signal path is automatically switched. However, the path cannot be switched to another input signal path if a synchronizing signal is applied to the selected input terminal.

SUMMARY OF THE INVENTION

In view of the foregoing, a main object of the present invention is to provide a priority switching apparatus of an input signal to switch among inputs according to their priority by assigning a priority level to each of a plurality of input terminals.

According to an aspect of the present invention, a priority switching apparatus of an input signal switches among input signals applied to a plurality of input terminals according to a priority level defined for each of the input terminals. A synchronizing signal detection circuit detects a synchronizing signal, if included, in an input signal applied to the plurality of input terminals. In response to detection of a synchronizing signal and a high priority, a switching circuit selects the input terminal to which that synchronizing signal is input, and outputs the input signal applied to that input terminal.

According to the present invention, a priority level is defined for each of the plurality of input terminals.

The input of a synchronizing signal is detected, and an input terminal of high priority is selected. Therefore, the information applied to the selected input terminal can be immediately provided on a display.

According to a preferable embodiment of the present invention, a priority level is set for each input terminal by a priority level setting circuit.

According to a further preferable embodiment of the present invention, a synchronizing signal is detected by detecting the frequency of the horizontal and vertical synchronizing signals.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
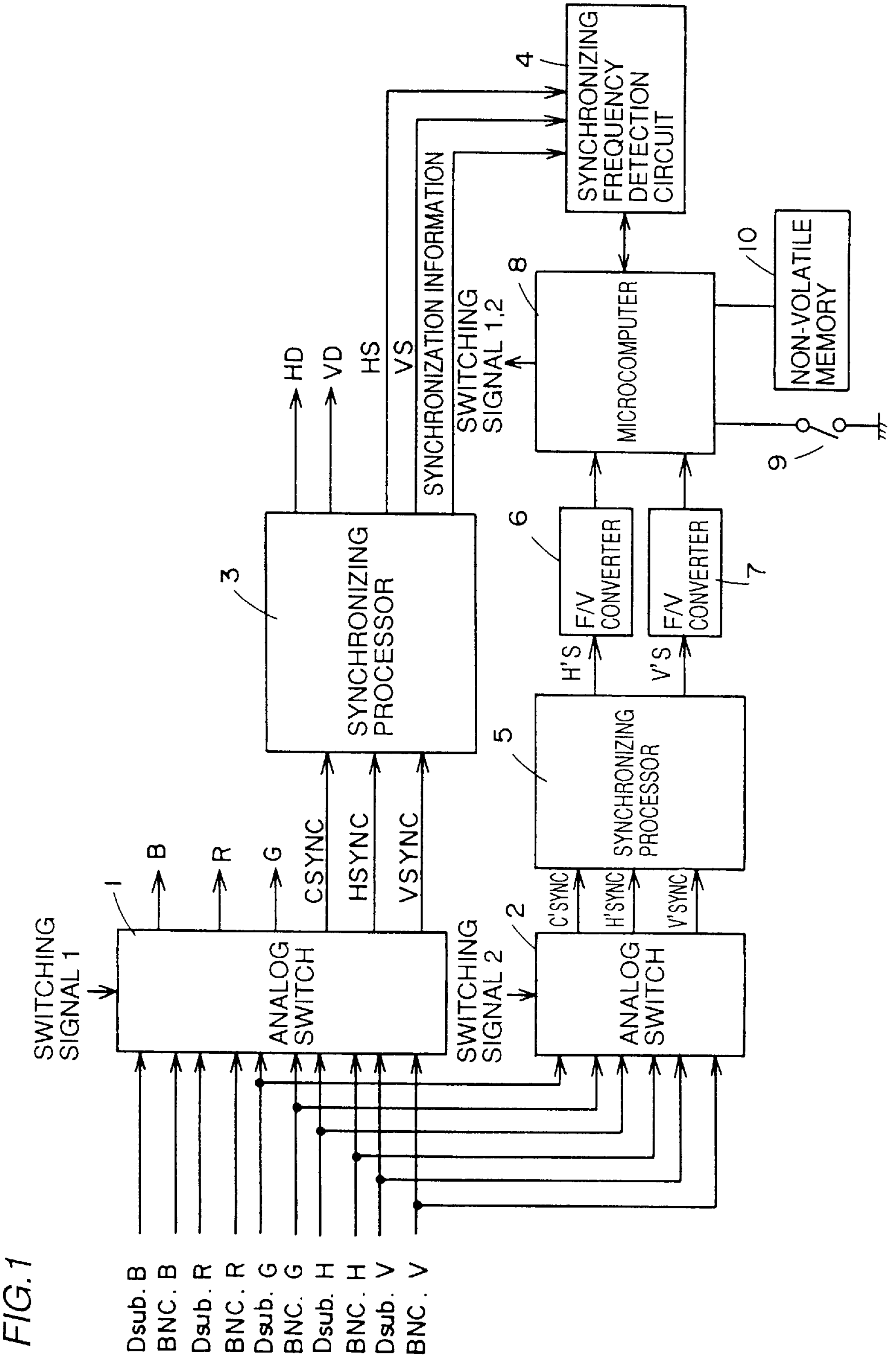
FIG. 1 is a block diagram of an embodiment of the present invention.
Figure 2:
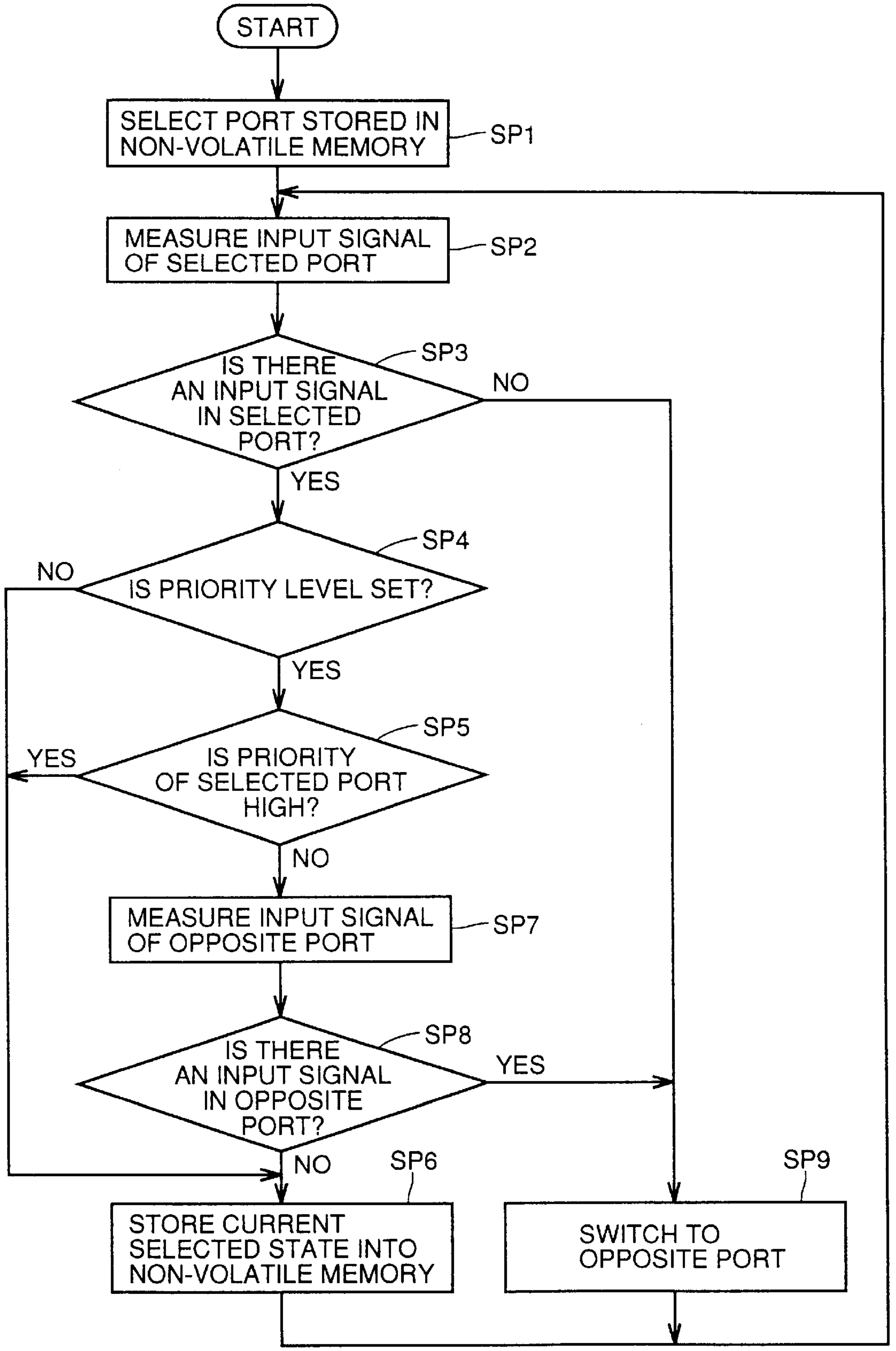
FIG. 2 is a flow chart for describing a specific operation of the embodiment of the present invention.

Referring to FIG. 1, a Dsub.B signal and a BNC.B signal, a Dsub.R signal and a BNC.R signal, a Dsub.G signal and a BNC.G signal, a Dsub.H signal and a BNC.H signal, and a Dsub.V signal and a BNC.V signal are applied to an analog switch 1. The synchronizing signals, which can be used in the present invention, include a sync-on green signal having horizontal and vertical synchronizing signals added to a video signal G, a composite sync signal having a vertical synchronizing signal added to a horizontal synchronizing signal, and separate sync signals which are respectively independent horizontal and vertical synchronizing signals. Analog switch 1 responds to a switching signal 1 from a microcomputer 8 which will be described afterwards to switch between an input from BNC connectors and an input from a Dsub connector to separate an input signal into video signals R, G, B, and signals C.SYNC (Composite Sync), H.SYNC and V.SYNC. Signals C.SYNC, H.SYNC and V.SYNC are provided to a synchronizing processor 3. The Dsub connector includes fifteen, for example, input pins to which signals Dsub.B-Dsub.V are applied. Synchronizing processor 3 generates a horizontal drive signal HD and a vertical drive signal VD which are sent to a deflection system, and a horizontal synchronizing signal HS, a vertical synchronizing signal VS, and a synchronization information signal having the polarity arranged. Signals HS and VS and the synchronization information signal are applied to a synchronizing frequency detection circuit 4. Synchronizing frequency detection circuit 4 measures the frequencies of signals HS and VS to provide the frequency detecting signal to microcomputer 8.

Signals Dsub.G and BNC.G, signals Dsub.H and BNC.H, and signals Dsub.V and BNC.V are also applied to an analog switch 2. Analog switch 2 responds to a switching signal 2 from microcomputer 8 to switch between the inputs from the BNC connector and the Dsub connector to generate and provide to a synchronizing processor 5 signals C'SYNC, H'SYNC and V'SYNC. Synchronizing processor 5 generates a horizontal synchronizing signal H'S and a vertical synchronizing signal V'S which are applied to F/V converters 6 and 7, respectively. F/V converters 6 and 7 equalize the respective pulse widths of signals H'S and V'S to integrate the pulses for conversion into a DC voltage. The DC voltage is applied to an A/D port of microcomputer 8. Microcomputer 8 determines change in the frequency according to a detection signal from synchronizing frequency detection circuit 4 and the voltage values applied from F/V converters 6 and 7. A switch 9 for setting the priority level and a non-volatile memory 10 for storing the current selected state of an input signal are connected to microcomputer 8. Switch 9 can be selectively set using on screen display.

A specific operation of the embodiment of the present invention will be described hereinafter with reference to FIGS. 1–4. Microcomputer 8 provides switching signals 1 and 2 to select a port (input terminal) stored in non-volatile memory 10 at step (abbreviated as "SP" in the figure) SP1 of FIG. 2. It is assumed that analog switch 1 selects the Dsub connector end by switching signal 1, and analog switch 2 selects the BNC connector end by switching signal 2. Signal C.SYNC or signals H.SYNC and V.SYNC are generated according to a signal from the Dsub connector selected by analog switch 1 to be provided to synchronizing processor 3. Synchronizing processor 3 provides signals HD, VD, HS, VS, and a synchronization information signal according to an input synchronizing signal. Signals HS and VS and the synchronization information signal are applied to synchronizing frequency detection circuit 4. Microcomputer 8 causes synchronizing frequency detection circuit 4 to detect the synchronizing signal in response to the current selection of a signal from the Dsub connector at step SP2. When the synchronizing signal is detected at step SP3, it is determined whether a priority level is set for the Dsub connector at step SP4. It is determined that a priority level is set if switch 9 is closed. When microcomputer 8 determines that a priority level is set, it is determined whether the priority level of the selected Dsub connector is high or not at step SP5. If the priority level is high, control proceeds to step SP6 where the currently selected information is stored in non-volatile memory 10. The operation of steps SP1-SP6 is executed repeatedly thereafter.

Figures 3A, 3B:
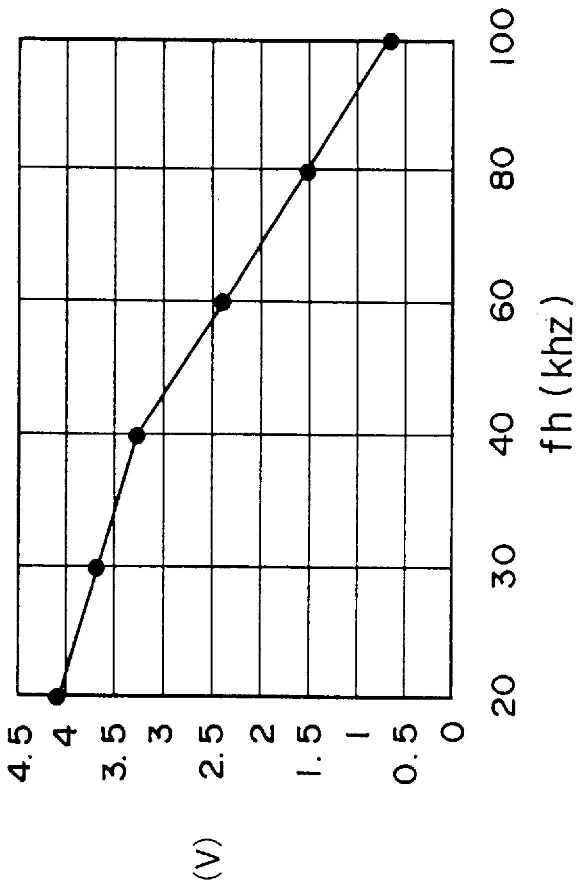
FIGS. 3A and 3B are diagrams indicating the relationship between a frequency of a horizontal synchronizing signal and a converted voltage value.
Figures 4A, 4B:
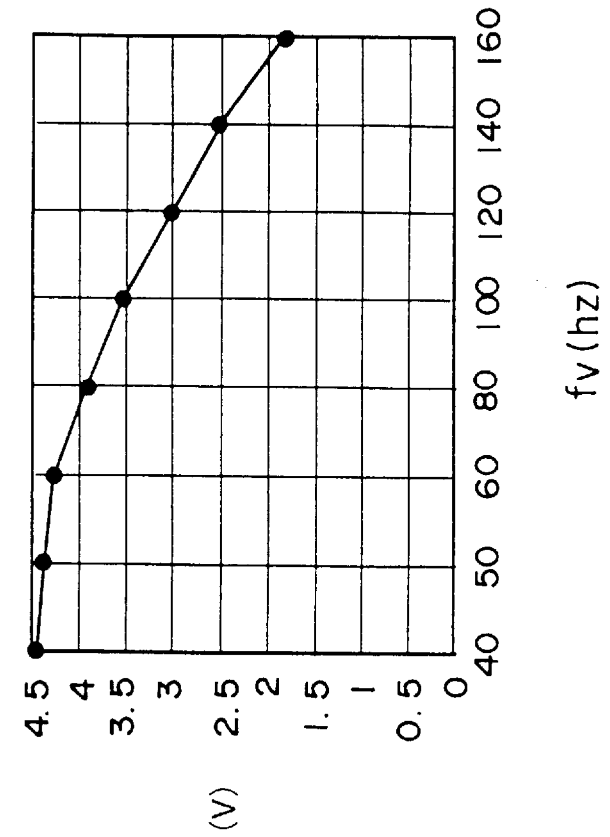
FIGS. 4A and 4B are diagrams showing the relationship between a frequency of a vertical synchronizing signal and a converted voltage value.

If it is determined that the priority level is not high at step SP5, control proceeds to steps SP7 where the input signal of the BNC connector which is the opposite port is measured. More specifically, analog switch 2 selects a signal of the BNC connector end, which is applied to synchronizing processor 5. Signals H'S and V'S provided from synchronizing processor 5 are integrated by F/V converters 6 and 7. Here, the relationship between the frequencies of signals H'S and V'S and the voltage value is as shown in FIGS. 3A, 3B, 4A and 4B. As shown in FIG. 3A, the frequency of a horizontal synchronizing signal corresponds to 20 kHz–100 kHz. Conversion of these frequencies into voltage values is shown in FIG. 3B. Referring to FIG. 4A, the frequency of a vertical synchronizing signal corresponds to 40 Hz–160 Hz. Conversion of these frequencies into voltage values is shown in FIG. 4B. When microcomputer 8 determines that there is an input signal from the opposite port, i.e., from the BNC connector, at step SP8, control proceeds to step SP9 where the input of the BNC connector end is selected by analog switch 1 and the input signal of the Dsub connector end is selected by analog switch 2.

According to an embodiment of the present invention, determination and switching of a signal can be effected instantaneously since the frequencies of synchronizing signals of two systems are continuously monitored. Unnecessary switching will not be carried out since the frequencies of the horizontal and vertical synchronizing signals can be measured. An intelligent control is possible since switching is not forced by means of hardware.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A priority switching apparatus for switching among input signals applied to a plurality of input terminals according to a selectable priority level for each input terminal, wherein a synchronizing signal may be included in each of said input signals, said priority switching apparatus comprising:

synchronizing signal detection means for detecting a synchronizing signal, when included, in the input signal applied to said plurality of input terminals; and switching means responsive to the detection of the synchronizing signal by said synchronizing signal detection means for selecting one of said plurality of input terminals to which said synchronizing signal is applied according to said selected priority level of said input terminals stored in a non-volatile memory, and switching to said input signal applied to said selected input terminal.

2. The priority switching apparatus of claim 1, further comprising priority level setting means for setting said priority level for said input terminals.

3. The priority switching apparatus of claim 1, wherein said synchronizing signal detection means detects a frequency of horizontal and vertical synchronizing signals.

4. A priority switching apparatus for switching an input signal path among a plurality of input terminals according to a selectable priority level for each input terminal, said priority switching apparatus comprising:

priority level setting means for setting the priority level of each input terminal;

input signal detection means for detecting whether an input signal is applied to any of said plurality of input terminals;

priority level determining means for determining the priority level of each input terminal;

switching means responsive to the detection of an input signal by the input signal detection means and the determination of a priority level by the priority level determining means, the switching means switching the input signal path from a first input terminal to a second input terminal if either no input signal is detected at the first input terminal, or the priority level of the first input terminal is not a high priority level and an input signal is detected at the second input terminal; and a non-volatile memory, wherein information identifying the input terminal to which the input signal path is switched is stored in the non-volatile memory.

5. The priority switching apparatus of claim 4, wherein each input signal includes a synchronizing signal, and the input signal detection means detects whether an input signal is present at an input terminal by detecting whether a synchronizing signal is present at the input terminal.

6. The priority switching apparatus of claim 5, wherein the synchronizing signal comprises horizontal and vertical synchronizing signals, and wherein the input signal detecting means detects whether a synchronizing signal is present by detecting a frequency of the horizontal and vertical synchronizing signals.

7. The priority switching apparatus of claim 4, wherein the input signal path is an input signal path in a computer monitor.

8. The priority switching apparatus of claim 4, wherein one of the plurality of input terminals is a BNC connector and one of the plurality of input terminals is a Dsub connector.

9. A method for switching an input signal path among a plurality of input terminals, a high priority level being assignable to one of the plurality of input terminals, the method comprising the following steps:

(a) selecting one of the plurality of input terminals as a currently selected input terminal, each input terminal that is not the currently selected input terminal being a currently unselected input terminal;

(b) detecting whether an input signal is present at the currently selected input terminal, and if no input signal is present at the currently selected input terminal, selecting one of the currently unselected input terminals as a new currently selected input terminal, switching the input signal path to the new currently selected input terminal, and repeating step (b) using the new currently selected input terminal as the currently selected input terminal;

(c) determining whether a priority level of the currently selected input terminal is the high priority level, and proceeding to step (f) if the priority level of the currently selected input terminal is the high priority level;

(d) detecting whether an input signal is present at a first currently unselected input terminal, and proceeding to step (f) if no input signal is present at the first currently unselected input terminal;

(e) selecting the first currently unselected input terminal as a new currently selected input terminal, storing information identifying the new currently selected input terminal in non-volatile memory, switching the input signal path to the new currently selected input terminal, and proceeding to step (b) using the new currently selected input terminal as the currently selected input terminal; and (f) maintaining the currently selected input terminal as the currently selected input terminal, and proceeding to step (b).

10. The method of claim 9, further comprising the following step between steps (b) and (c):

determining whether a priority level is set for the currently selected input terminal, and proceeding to step (f) if no priority level is set for the currently selected input terminal.

11. The method of claim 9, wherein step (a) further comprises switching the input signal path to the currently selected input terminal.

12. The method of claim 9, wherein the selecting of one of the first and second input terminals as the currently selected input terminal is accomplished by reading the information identifying the currently selected input terminal from non-volatile memory.

13. The method of claim 9, wherein each input signal includes a synchronizing signal, and the detecting of whether an input signal is present at an input terminal further comprises detecting whether a synchronizing signal is present at the input terminal.

14. The method of claim 13, wherein the synchronizing signal comprises horizontal and vertical synchronizing signals, and wherein the detecting of whether a synchronizing signal is present further comprises detecting a frequency of the horizontal and vertical synchronizing signals.

15. The method of claim 9, wherein the input signal path is an input signal path in a computer monitor.

16. The method of claim 9, wherein one of the plurality of input terminals is a BNC connector and one of the plurality of input terminals is a Dsub connector.

* * * * *